(12) United States Patent
Ito et al.

(10) Patent No.: US 7,940,200 B2
(45) Date of Patent: May 10, 2011

(54) CALIBRATION METHOD, A/D CONVERTER, AND RADIO DEVICE

(75) Inventors: Tomohiko Ito, Kanagawa-ken (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/637,211

(22) Filed: Dec. 14, 2009

(65) Prior Publication Data

US 2010/0149009 A1    Jun. 17, 2010

(30) Foreign Application Priority Data

Dec. 15, 2008  (JP) ................................ P2008-318081

(51) Int. Cl.
*H03M 1/10* (2006.01)
(52) U.S. Cl. ........................................ 341/120; 341/155
(58) Field of Classification Search .......... 341/120–155; 375/345, 295; 248/243; 330/9, 2, 278, 254; 127/124; 369/124.1; 359/337
See application file for complete search history.

(56) References Cited

U.S. PATENT DOCUMENTS

| | | | | |
|---|---|---|---|---|
| 5,621,329 A * | 4/1997 | Tsao et al. | ................. | 324/601 |
| 6,252,454 B1 * | 6/2001 | Thompson et al. | ................. | 330/9 |
| 7,046,179 B1 * | 5/2006 | Taft et al. | ................. | 341/120 |
| 7,088,278 B2 | 8/2006 | Kurose et al. | | |
| 7,236,118 B2 | 6/2007 | Kurose et al. | | |
| 7,250,895 B2 | 7/2007 | Kurose et al. | | |
| 7,348,839 B2 * | 3/2008 | Fahim et al. | ................. | 330/9 |
| 7,548,590 B2 * | 6/2009 | Koller et al. | ................. | 375/295 |
| 2008/0175132 A1 * | 7/2008 | Chou et al. | ................. | 369/124.1 |
| 2009/0251572 A1 * | 10/2009 | Lin et al. | ................. | 348/243 |

OTHER PUBLICATIONS

Kazutaka Honda et al., "A 14b Low-power Pipeline A/D Converter Using a Pre-charging Technique", 2007 Symposium on VLSI Circuits Digest of Technical Papers, pp. 196-197.

* cited by examiner

*Primary Examiner* — Lam T Mai
(74) *Attorney, Agent, or Firm* — Oblon, Spivak, McClelland, Maier & Neustadt, L.L.P.

(57) ABSTRACT

There is disclosed a calibration method for an A/D converter. The A/D converter includes a first amplifier to amplify first and second voltage signals, a second amplifier to amplify the first and second voltage signals amplified by the first amplifier, and a comparator to compare the first and second voltage signals amplified by the second amplifier. The calibration method performs short-circuiting input ports of the second amplifier, comparing the first and second voltage signals inputted to the comparator to obtain a first result, calibrating output voltage of the second amplifier according to the first result, short-circuiting input ports of the first amplifier, opening the short-circuited input ports of the second amplifier, comparing the first and second voltage signals inputted to the comparator to obtain a second result, and calibrating output voltage of the first amplifier according to the second result.

10 Claims, 11 Drawing Sheets

CALIBRATION METHOD, A/D CONVERTER, AND RADIO DEVICE

CROSS-REFERENCE TO RELATED APPLICATIONS

This application is based upon and claims the benefit of priority from the Japanese Patent Application No. 2008-318081, filed on Dec. 15, 2008, the entire contents of which are incorporated herein by reference.

BACKGROUND OF THE INVENTION

1. Field of the Invention

The present invention relates to a calibration method, an A/D converter, and a radio device.

2. Description of the Related Art

In a parallel analog/digital (A/D) converter as typified by a flash A/D converter, comparators are arranged in parallel with one another in accordance with a required resolution. A plurality of pre amplifiers in series are disposed at an input port side of each of the comparators. Each comparator compares a voltage of a pre-amplified analog signal with a reference voltage to find which one of voltages is higher than the other. The A/D converter outputs a digital signal according to the comparison result. In the A/D converter, the resolution is degraded because of the presence of offset voltages of the comparators and the pre amplifiers.

One technique to reduce the degradation is disclosed in "A 1-V 1.25-GS/S 8-Bit Self-Calibrated Flash ADC in 90-nm Digital CMOS", IEEE TRANSACTIONS ON CIRCUITS AND SYSTEMS-II:EXPRESS BRIEFS, JULY 2008, VOL. 55, NO. 7, p. 668-672. In this reference, the A/D converter performs calibration of an offset of the pre amplifier located at a first stage in series.

However, in the conventional method, the offset voltage of the pre amplifier at the first stage is amplified by a pre amplifier at a second stage in series. Accordingly, a voltage range to calibrate the offset voltage needs to be set large. This makes it difficult to design an operation with a low power supply voltage. Further, if the offset voltage of the pre amplifiers at the first stage is calibrated as in the conventional method, a residual offset of an interpolation voltage cannot be calibrated in a parallel A/D converter when using an interpolation technique.

SUMMARY OF THE INVENTION

According to one aspect of the invention, a calibration method for an A/D converter including a first amplifier to amplify first and second voltage signals, a second amplifier to amplify the first and second voltage signals amplified by the first amplifier, and a comparator to compare the first and second voltage signals amplified by the second amplifier, includes
short-circuiting input ports of the second amplifier;
comparing the first and second voltage signals inputted to the comparator to obtain a first result;
calibrating output voltage of the second amplifier in accordance with the first result of the comparison by the comparator;
short-circuiting input ports of the first amplifier;
opening the short-circuited input ports of the second amplifier;
comparing the first and second voltage signals inputted to the comparator to obtain a second result; and
calibrating output voltage of the first amplifier in accordance with the second result of the comparison by the comparator.

According to other aspect of the invention, a calibration method for an A/D converter including a first amplifier to amplify first and second voltage signals, a second amplifier to amplify the first and second voltage signals amplified by the first amplifier, a first comparator to compare the first and second voltage signals amplified by the second amplifier, a third amplifier to amplify third and fourth voltage signals, a fourth amplifier to amplify the third and fourth voltage signals amplified by the third amplifier, a second comparator to compare the third and fourth voltage signals amplified by the fourth amplifier, a first generation unit to generate an intermediate voltage signal between the first and third voltage signals amplified by the first and third amplifiers, respectively, a second generation unit to generate an intermediate voltage signal between the second and fourth voltage signals amplified by the first and third amplifiers, respectively, a fifth amplifier to amplify the intermediate voltage signals generated by the first and second generation units, respectively, and a third comparator to compare the intermediate voltage signals amplified by the fifth amplifier, the method includes
short-circuiting input ports of each of the second and fourth amplifiers;
comparing the first and second voltage signals inputted to the first comparator;
comparing the third and fourth voltage signals inputted to the second comparator;
comparing the intermediate voltage signals inputted to the third comparator;
calibrating output voltages of the second, fourth and fifth amplifiers in accordance with results of the comparisons by the first to third comparators, respectively;
short-circuiting input ports of each of the first and third amplifiers;
opening the short-circuited input ports of each of the second and fourth amplifiers;
comparing the first and second voltage signals inputted to the first comparator;
comparing the third and fourth voltage signals inputted to the second comparator; and
calibrating output voltages of the first and third amplifiers in accordance with results of the comparisons by the first and second comparators, respectively.

According to other aspect of the invention, an A/D converter includes
a first amplifier to amplify first and second voltage signals;
a second amplifier to amplify the first and second voltage signals amplified by the first amplifier;
a first comparator to compare the first and second voltage signals amplified by the second amplifier;
a first switch to short-circuit input ports of the first amplifier;
a second switch to short-circuit input ports of the second amplifier;
a first calibration unit to calibrate output voltages of the second amplifier in accordance with a result of the comparison by the first comparator while the second switch is keeping on; and
a second calibration unit to calibrate output voltages of the first amplifier in accordance with the result of the comparison by the first comparator while the first switch is keeping on and the second switch is keeping off.

According to other aspect of the invention, a radio device includes
a receiver to receive a radio signal;
a converter to convert the radio signal into a baseband signal including first and second voltage signals;
a first amplifier to amplify the first and second voltage signals converted by the converter;
a second amplifier to amplify the first and second voltage signals amplified by the first amplifier;
a comparator to compare the first and second voltage signals amplified by the second amplifier thereby to generate a digital signal;
a first switch to short-circuit input ports of the first amplifier;
a second switch to short-circuit input ports of the second amplifier;
a first calibration unit to calibrate output voltages of the second amplifier in accordance with a result of the comparison by the comparator while the second switch is keeping on;
a second calibration unit to calibrate output voltages of the first amplifier in accordance with the result of the comparison by the comparator while the first switch is keeping on and the second switch is keeping off; and
a signal processor to demodulate the digital signal from the first comparator.

DETAILED DESCRIPTION OF THE INVENTION

The embodiments will be explained with reference to the accompanying drawings.

Description of the First Embodiment

Figure 1:
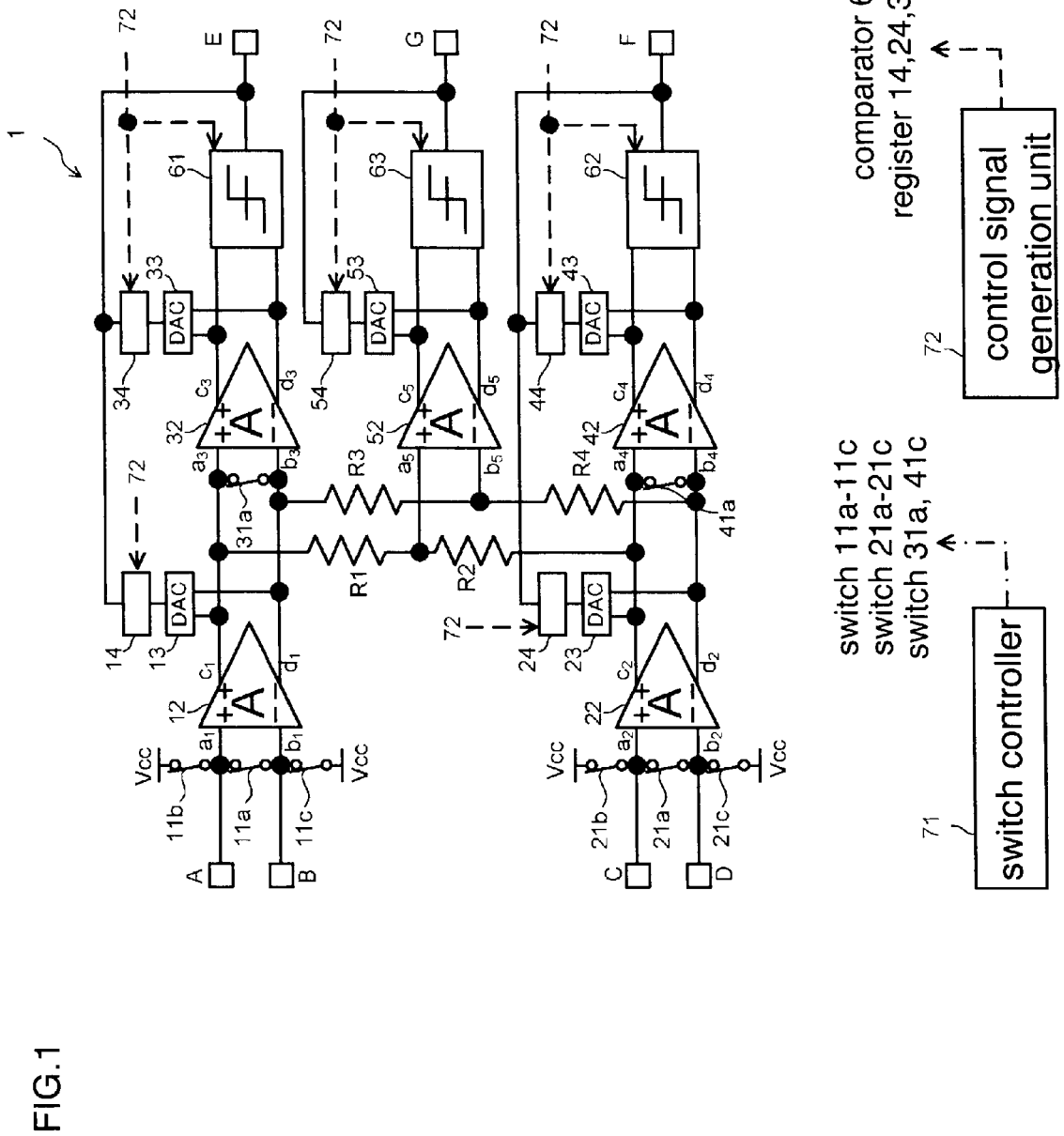
FIG. 1 is a diagram showing an example of a configuration of an A/D converter according to a first embodiment.

FIG. 1 is a diagram showing an example of a configuration of an A/D converter 1 according to a first embodiment. The A/D converter 1 according to the first embodiment is a parallel A/D converter using an interpolation technique.
As shown in FIG. 1, the A/D converter 1 of the embodiment includes pre amplifiers 12, 32 and a comparator 61 connected in series (first A/D converter). The A/D converter 1 also includes pre amplifiers 22, 42, and a comparator 62 connected in series (second A/D converter) in the same manner, as well as a pre amplifier 52 and a comparator 63 connected in series (third A/D converter) in the same manner.

Firstly, a configuration of the first A/D converter will be described. Terminals A, B are connected to input ports $a_1$, $b_1$ (hereinafter, simply referred to as inputs $a_1$, $b_1$) of the pre amplifier 12, respectively. Switches 11b, 11c, which short-circuit the inputs $a_1$, $b_1$ of the pre amplifier 12 to power supplies Vcc, are connected to the inputs $a_1$, $b_1$, respectively.

In addition, a switch 11a, which short-circuits each of the inputs $a_1$, $b_1$ of the pre amplifier 12, is connected between the inputs $a_1$, $b_1$. Output ports $c_1$, $d_1$ (hereinafter, simply referred to as outputs $c_1$, $d_1$) of the pre amplifier 12 are connected to input ports $a_3$, $b_3$ (hereinafter, simply referred to as inputs $a_3$, $b_3$) of the pre amplifier 32, respectively. In addition, a switch 31a, which short-circuits each of the inputs $a_3$, $b_3$, is connected between the inputs $a_3$, $b_3$ of the preamplifier 32.

Output ports $c_3$, $d_3$ (hereinafter, simply referred to as outputs $c_3$, $d_3$) of the pre amplifier 32 are connected to inputs of the comparator 61. An output of the comparator 61 is connected to a terminal E and inputs of registers 14, 34. Outputs of the registers 14, 34 are connected to inputs of DAC 13, 33, respectively. Here, each of the DACs 13, 33 is a current output type digital/analog (DA) converter. Outputs of the DAC 13 are connected to the outputs $c_1$, $d_1$ of the pre amplifier 12. Outputs of the DAC 33 are connected to the outputs $c_3$, $d_3$ of the pre amplifier 32. Specifically, the each of the DACs 13, 33 adjust amount of electric current flowing through the pre amplifier 12, 32 according to the input from the comparator 61 in order to calibrate voltages of the outputs $c_1$, $d_1$, $c_3$, $d_3$ of the pre amplifiers 12, 32.

Next, a configuration of the second A/D converter will be described. The configuration of the second A/D converter is substantially the same as the configuration of the first A/D converter. To be specific, the pre amplifiers 22, 42 and the comparator 62 correspond to the pre amplifiers 12, 32 and the comparator 61, respectively. Switches 21a to 21c and 41a correspond to the switches 11a to 11c and 31a, respectively. Registers 24, 44 and DACs 23, 43 correspond to the registers 14, 34 and the DACs 13, 33, respectively. Note that, the second A/D converter is different from the first A/D converter in that inputs $a_2$, $b_2$ of the pre amplifier 22 are connected to terminals C, D, respectively, and an output of the comparator 62 is connected to a terminal F.

Next, a configuration of the third A/D converter will be described. Input ports $a_5$, $b_5$ (hereinafter, simply referred to as inputs $a_5$, $b_5$) of the pre amplifier 52 are connected to the outputs $a_1$, $b_1$ of the pre amplifier 12 and the outputs $a_2$, $b_2$ of the pre amplifier 22 via resistances R1, R2 and resistances R3, R4, respectively. Output ports $c_5$, $d_5$ (hereinafter, simply referred to as outputs $c_5$, $d_5$) of the pre amplifier 52 are connected to the inputs of the comparator 63. An output of the comparator 63 is connected to a terminal G and an input of a register 54. An output of the register 54 is connected to an input of a DAC 53, which is a current output type D/A converter. Outputs of the DAC 53 are connected to the outputs $c_5$, $d_5$ of the pre amplifier 52. Specifically, the DAC 53 adjusts amount of electric current flowing through the pre amplifier 52 according to the input from the comparator 63 in order to calibrate voltages of the outputs $c_5$, $d_5$ of the pre amplifier 52. The resistances R1, R2 and the resistances R3, R4 provide first and second generation units, respectively.

A switch controller 71 controls on/off (open/close) operations of all the switches 11a to 11c, the switches 21a to 21c, and the switches 31a, 41a. A control signal generation unit 72 inputs a control signal to all of the registers 14, 24, 34, 44, 54 and the comparators 61 to 63 and thereby control the operations.

Here, the pre amplifiers 12, 32, 22, 42, 52 form first to fifth amplifiers, respectively. The comparators 61 to 63 form first to third comparison units, respectively. The switches 11a, 31a, 21a, 41a form first to fourth switches, respectively.

The DAC 33 and the register 34 form a first calibration unit. The DAC 13 and the register 14 form a second calibration unit. The DAC 43 and the register 44 form a third correction unit. The DAC 23 and the register 24 form a fourth calibration unit. The DAC 53 and the register 54 form a fifth calibration unit.

Moreover, the DACs 33, 13, 43, 23, 53 form first to fifth current supply units, respectively. The registers 34, 14, 44, 24, 54 form first to fifth controllers, respectively.

Next, an operation of each of the constituent elements will be described. Firstly, an operation of the first A/D converter will be described. Analog positive signals (non-inverted signals), negative analog signals (inverted signals) are inputted to the terminals A to D. Note that, the analog signals inputted to the terminals A to D form first to fourth voltage signals, respectively.

The pre amplifier 12 amplifies the analog signals inputted to the terminals A, B. The pre amplifier 32 amplifies the analog signals amplified by the pre amplifier 12. Note that, each amplification gain of the pre amplifiers 12, 32 is termed as A.

The comparator 61 compares voltages of a positive output $c_3$ and a negative output $d_3$ of the analog signal from the pre amplifier 32. Here, the two voltages are with respect to ground (GND). The comparator 61 inputs digital signals (High signal, Low signal) to the registers 14, 34 and the terminal E in accordance with the comparison result.

The registers 14, 34 control the DACs 13, 33 in accordance with the input digital signals from the comparator 61 and signals from the control signal generation unit 72, respectively. The DACs 13, 33 calibrate voltages of the outputs $c_1$, $d_1$, $c_3$, $d_3$ of the pre amplifiers 12, 32 by input signals from the registers 14, 34, respectively. An operation of the second A/D converter is the same as the operation of the first A/D converter, so that a duplicative description is omitted.

The third A/D converter will be described. The pre amplifier 52 amplifies intermediate voltage signals (interpolation signals) at a connection point of the resistances R1, R2 and a connection point of the registers R3, R4. An amplification gain of the pre amplifier 52 is termed as A. Note that, resistance values of the resistances R1 to R4 are sufficiently larger than resistance values of load resistances of the pre amplifiers 12, 22, 32, 42, 52. Accordingly, currents flowing through the resistances R1 to R4 are sufficiently small as compared with currents flowing through the pre amplifiers 12, 22, 32, 42, 52 and thus ignorable.

The comparator 63 compares voltages of a positive output $c_5$ and a negative output $d_5$ of an analog signal from the pre amplifier 52, the voltages being with respect to GND. The comparator 63 inputs a digital signal to the register 54 and the terminal G in accordance with the comparison result.

The register 54 inputs a signal to the DAC 53 in accordance with the input signal from the comparator 63 and a control signal from the control signal generation unit 72. The DAC 53 calibrates the voltages of the outputs $c_5$, $d_5$ of the pre amplifier 52 by the input signal from the register 54.

(Description of Pre Amplifier, DAC)

Figure 2:
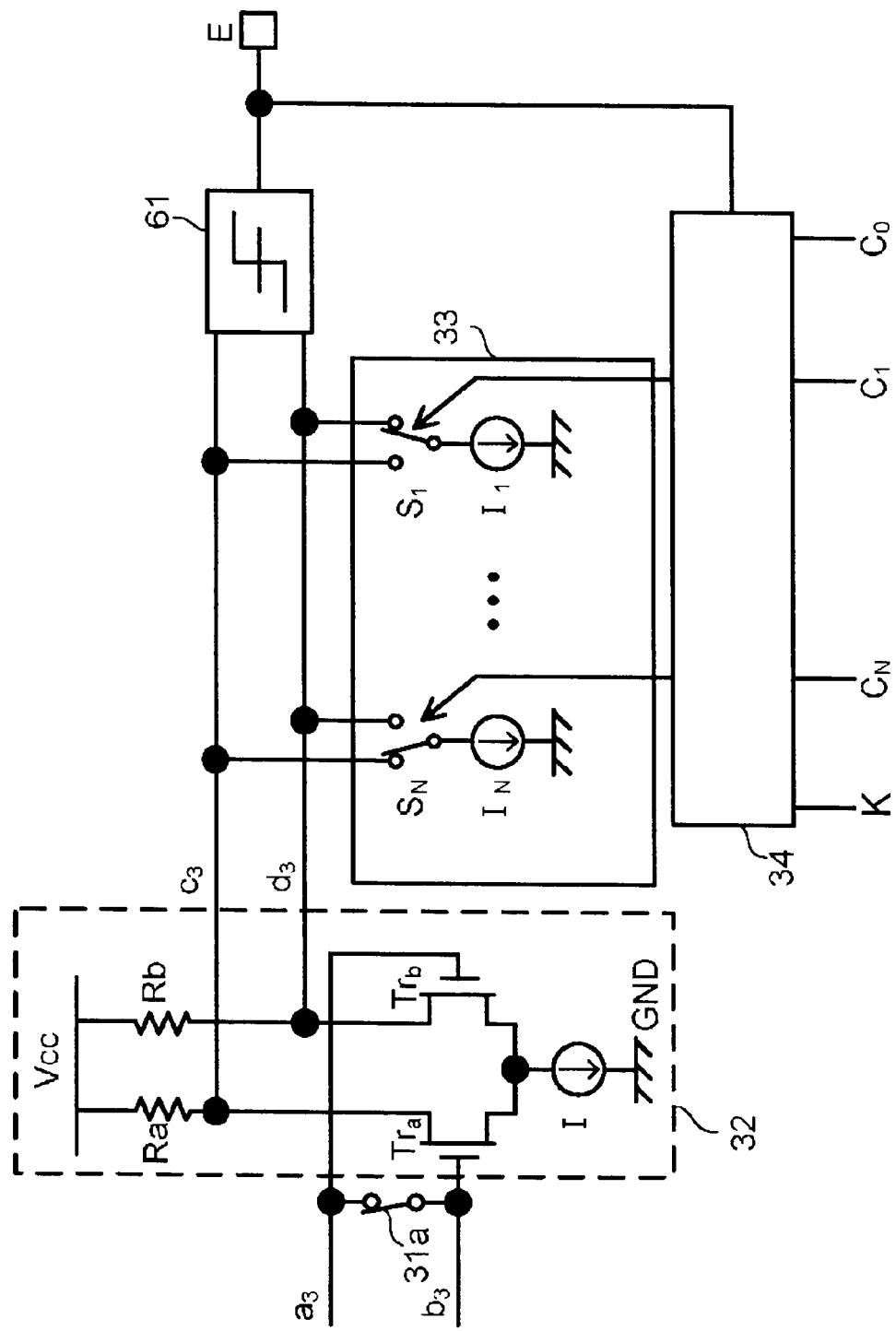
FIG. 2 is a diagram showing an example of a configuration of a pre amplifier and a DAC.

FIG. 2 is a diagram showing an example of a configuration of the pre amplifier 32 and the DAC 33.

The pre amplifier 32 is formed of a differential pair formed of a power source I and two transistors Tra, Trb, and load resistances Ra, Rb. Each of the resistance values of the load resistances Ra, Rb is termed as R.

The DAC 33 includes power sources $I_1$ to $I_N$ and switches $S_1$ to $S_N$ (N is a positive integer). One ports of the switches $S_1$ to $S_N$ are selectably connected to the positive output $c_3$ or the negative output $d_3$ of the pre amplifier 32.

The other ports of the switches $S_1$ to $S_N$ are connected to the current sources $I_1$ to $I_N$ (N is a positive integer). The switches $S_1$ to $S_N$ short-circuit the aforementioned one ports to the positive output $c_3$ or the negative output $d_3$ of the pre amplifier 32 in accordance with an input signal from the register 34 (N is a positive integer).

Current values of the current sources $I_1$ to $I_N$ are binary weighted. Provided that the unit current is I, the current values of the power sources $I_1$ to $I_N$ are I, 2I, 4I, ... $2^{N-1}$I. Here, the current source $I_N$ corresponds to the most significant bit (MSB). Moreover, the current source $I_1$ corresponds to the least significant bit (LSB).

The configurations of the pre amplifiers 12, 22, 42, 52 and the DACs 13, 23, 43, 53, are the same as the configuration of the pre amplifier 32 and the DAC 33. Thus, a duplicative description is omitted herein.

(Description of Register)

Figure 3:
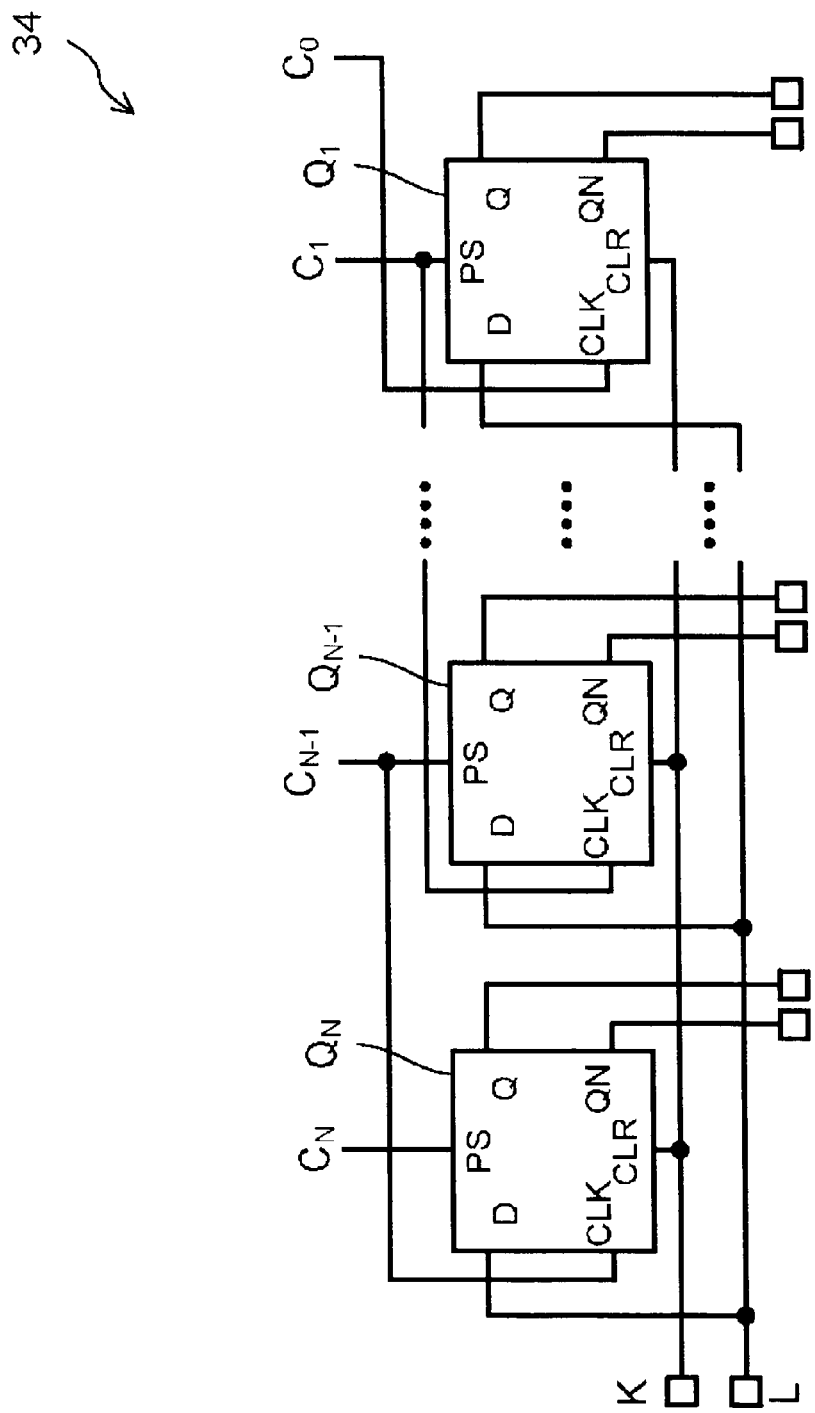
FIG. 3 is a diagram showing an example of a configuration of a register.

FIG. 3 is a diagram showing an example of a configuration of the register 34. The register 34 includes D-type flip flops (hereinafter, referred to as FFs) $Q_1$ to $Q_N$ (N is a positive integer). The FF $Q_N$ corresponds to the most significant bit. The FF $Q_1$ corresponds to the least significant bit.

A reset (Reset) signal is inputted to a terminal K from the control signal generation unit 72. Upon input of the reset signal to the register 34 from the control signal generation unit 72, one port of the switch $S_N$ of the DAC 33 is connected to the positive output $c_3$ of the pre amplifier 32. In addition, one ports of the switches $S_1$ to $S_{N-1}$ are connected to the negative output $d_3$ of the pre amplifier 32.

The Low signal or High signal is inputted to a terminal L from the comparator 61. The FF $Q_1$ to FF $Q_N$ control connection destinations of the switches $S_1$ to $S_N$ of the DAC 33 in accordance with the input signals $C_1$ to $C_N$ from the control signal generation unit 72 and the Low signal or High signal from the comparator 61.

The input signals $C_1$ to $C_N$ indicate a bit to be calibrated. Each of the input signals $C_1$ to $C_N$ turns to High in order from $C_N$ to $C_1$. Other input signals $C_1$ to $C_N$ except for an input signal $C_k$ of High are Low. When the input signal $C_k$ is High, k-th bit is calibrated. After all bits have calibrated, all input signals $C_1$ to $C_N$ become Low.

Moreover, output signals Q, QN are differential output signals. For example, if the output signal Q is High, the output signal QN is Low. When the output signal Q is High, the switch $S_k$ is connected to the resister Ra. On the other hand, when the output signal Q is Low, the switch $S_k$ is connected to the resister Rb.

The input signal $C_k$ of the High signal to a PS (Preset) of the FF $Q_K$ (1=K=N: N is a positive integer) from the control signal generation unit 72, one port of the switch $S_K$ of the DAC 33 is connected to the positive output $c_3$ of the pre amplifier 32. At this time, the input signal to the terminal K of the High signal from the comparator 61, one port of the switch $S_{K+1}$ of the DAC 33 is connected to the positive output $c_3$ of the pre amplifier 32. Upon input of the Low signal from the comparator 61, the one port of the switch $S_{K+1}$ of the DAC 33 is connected to the negative output $d_3$ of the pre amplifier 32. In addition, the connection states of the switches $S_1$ to $S_N$ determined by the aforementioned operations are maintained until a reset signal is inputted.

The configurations of the registers 14, 24, 44, 54 are the same as the configuration of the register 34. Thus, a duplicative description is omitted.

(Description of Comparator)

Figure 4:
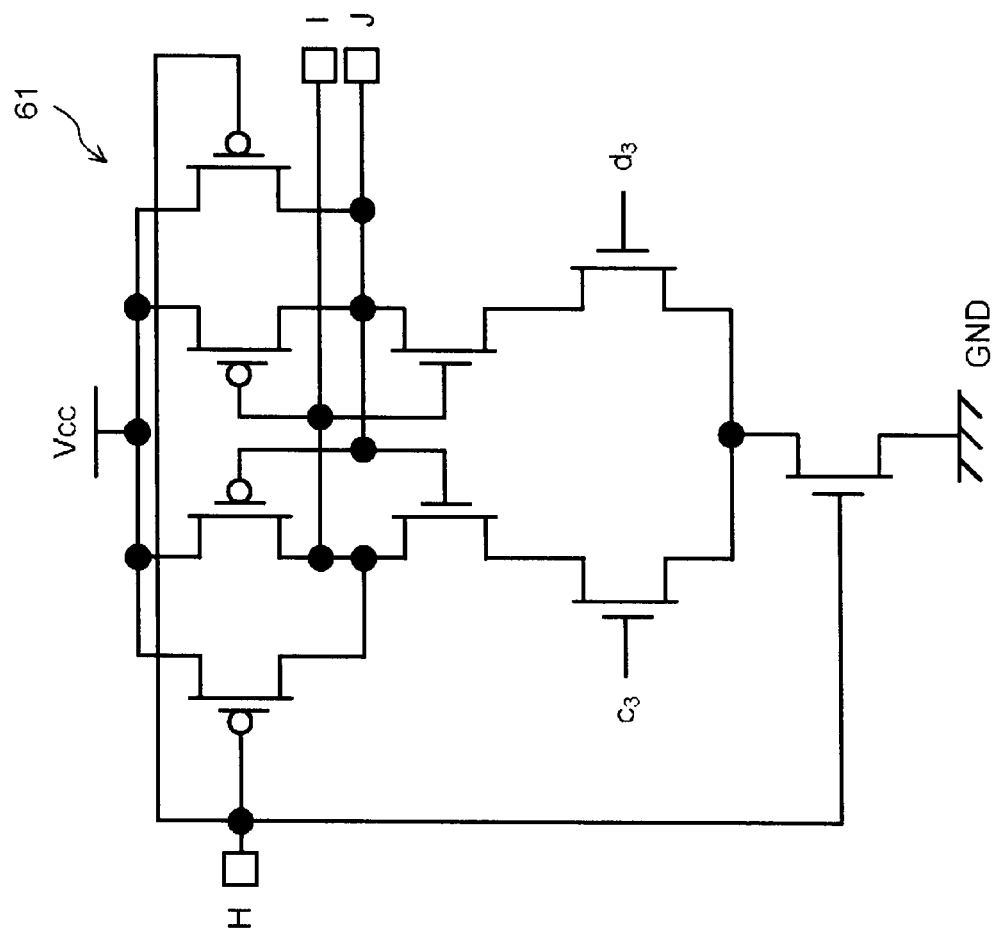
FIG. 4 is a diagram showing an example of a configuration of a comparator.

FIG. 4 is a diagram showing an example of a configuration of the comparator 61. A control signal X which is a clock signal from the control signal generation unit 72 is inputted to a terminal H. Upon input of the control signal to the terminal H, the comparator 61 compares voltages of the outputs $c_3$, $d_3$ from the pre amplifier 32.

If the voltage of the positive output $c_3$ is higher than the voltage of the negative output $d_3$, the comparator 61 outputs the High signal from a terminal J. If the voltage of the negative output $d_3$ is higher than the voltage of the positive output $c_3$, the comparator 61 outputs the Low signal from the terminal J. The configurations of the comparators 62, 63 are the same as the configuration of the comparator 61. Thus, a duplicative description is omitted.

(Description of Calibration of Offset Voltage)

Figure 5:
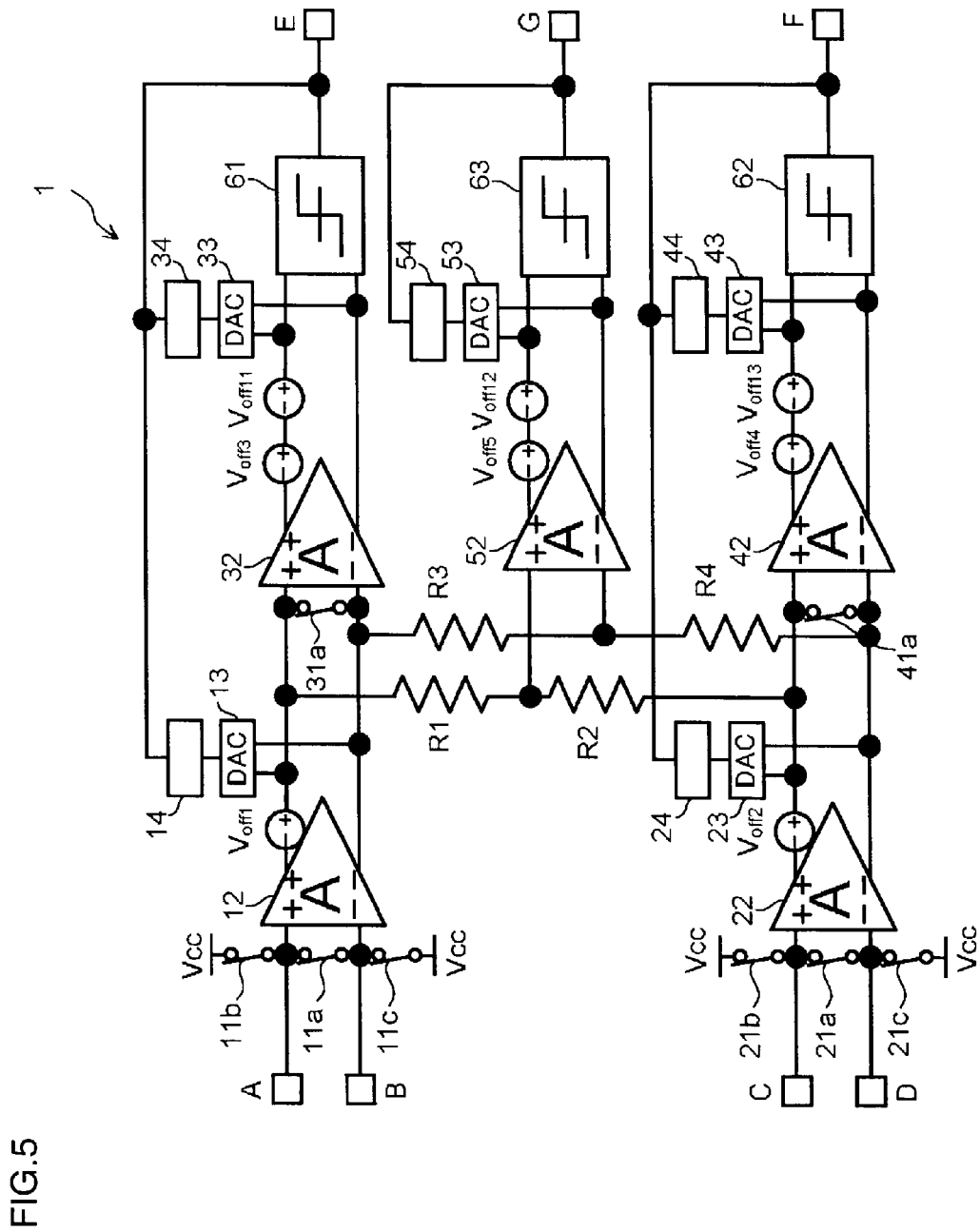
FIG. 5 is a diagram to describe calibration of an offset voltage.

FIG. 5 is a diagram to describe calibration of an offset voltage. FIG. 5 illustrates output offset voltages $V_{off1}$ to $V_{off5}$ of the pre amplifiers 12, 22, 32, 42, 52 and input conversion offset voltages $V_{off11}$ to $V_{off13}$ of the terminals A to D of the comparators 61, 62, 63 if the positive inputs (non-inverted inputs) and the negative inputs (inverted inputs) of the pre amplifiers 12, 22, 32, 42, 52 are connected and set to have the same potentials.

In FIG. 5, illustrations of the switch controller 71 and the control signal generation unit 72 are omitted. As to the other constituent elements, the same constituent elements as those in FIG. 1 are denoted by the same reference numerals. Since these constituent elements are already described in FIG. 1, a duplicative description is omitted. Here, the calibration of an offset voltage will be described using FIG. 1 and FIG. 5.

The input $a_3$ and the negative input $b_3$ of the pre amplifier 32 are short-circuited by turning on the switch 31a. Then, the output offset voltage $V_{off1}$ of the pre amplifier 12 becomes 0. Thus, the output offset voltage $V_1$ of the pre amplifier 32 is expressed by following formula (1).

$$V_1 = V_{off3} + V_{off11} \quad (1)$$

Next, the control signal generation unit 72 resets the register 34 and inputs a control signal $C_N$ to the FF $Q_N$ corresponding to the most significant bit of the register 34. At this time, a current $2^{N-1}I$ of the current source $I_N$ of the most significant bit of the DAC 33 flows through the load resistance Ra on the positive output $c_3$ side of the pre amplifier 32 shown in FIG. 2. Accordingly, the voltage of the positive output $c_3$ of the pre amplifier 32 decreases by the amount of $2^{N-1}I$.

On the other hand, the currents $2^{N-2}I$ to I of the current sources $I_{N-1}$ to $I_1$ other than the most significant bit of the DAC 33 flow through the load resistance Rb on the negative output $d_3$ side of the pre amplifier 32. Thus, the voltage of the positive output $c_3$ of the pre amplifier 32 decreases by the amount of $2^{N-2}IR$. As a result, an output offset voltage $V_2$ of the pre amplifier 32 is expressed by following formula (2).

$$V_2 = V_{off3} + V_{off11} + IR \quad (2)$$

Next, the High signal or Low signal is inputted to the register 34 in accordance with a result of comparison between the voltage of the positive output $c_3$ and the voltage of the negative output $d_3$ of the pre amplifier 32. When the voltage of the positive output $c_3$ of the pre amplifier 32 is higher than the voltage of the negative output $d_3$, the Low signal is inputted to the register 34. When the voltage of the negative output $d_3$ of the pre amplifier 32 is higher than the voltage of the positive output $c_3$, the High signal is inputted to the register 34.

Next, the control signal generation unit 72 turns off the control signal $C_N$ that has been inputted to the FF $Q_N$ of the register 34 and then inputs the control signal $C_{N-1}$ to the FF $Q_{N-1}$ of the register 34. At this time, if the High signal is inputted from the comparator 61, the connection destination of the switch $S_N$ of the DAC 33 is kept at the positive output $c_3$ of the pre amplifier 32. On the other hand, if the Low signal is inputted from the comparator 61, the connection destination of the switch $S_N$ of the DAC 33 is changed to the negative output $d_3$ of the pre amplifier 32.

Next, the switch $S_{N-1}$ of the DAC 33 is switched, and the control signal generation unit 72 causes the current $2^{N-2}I$ of the current source $I_{N-1}$, which is the second bit from the most significant bit, to flow through the resistance Ra on the positive output $c_3$ side of the pre amplifier 32. The aforementioned operation is performed from the most significant bit to the least significant bit of the DAC 33. Eventually, upon input of the High signal to CLK of the FF $Q_1$ of the register 34 from the control signal generation unit 72, the connection destination of the switch $S_1$ corresponding to the least significant bit is stored in the register 34.

As described above, if the High signal is inputted to the register 34 from the comparator 61, the output offset voltage $V_{off3} + V_{off11}$ of the pre amplifier 32 is determined to be a positive value. Then, the current to flow through the resistance Ra on the positive output $c_3$ side of the pre amplifier 32 is increased, and thereby, the offset voltage $V_{off3} + V_{off11}$ is decreased in a stepwise manner.

In addition, if the Low signal is inputted to the register 34 from the comparator 61, the output offset voltage $V_{off3} + V_{off11}$ of the pre amplifier 32 is determined to be a negative value. Then, the current to flow through the resistance Ra on the negative output $d_3$ side of the pre amplifier 32 is increased, and thereby, the offset voltage $V_{off3} + V_{off11}$ is increased in a stepwise manner.

The current values of the current sources $I_1$ to $I_N$ included in the DAC 33 are binary weighted. Accordingly, a current value that flows through the resistances Ra, Rb of the pre amplifier 32 in a given bit $B_K$ ($1 \leq k \leq N$) is larger than the sum of current values that flow through the resistances Ra, Rb of the pre amplifier 32 in bits $B_{k-1}$ to $B_1$, which are lower-order bits than the bit $B_k$. As a result, the output offset voltage $V_{off3} + V_{off11}$ of the pre amplifier 32 can be reduced.

In addition, while the switches 11a to 11c are turned on, the switch 31a is turned off. In this case, the output offset voltage of the pre amplifier 12 is $V_{off1}$.

The offset voltage $V_{off1}$ is successively and relatively calibrated by using the pre amplifier 32, the comparator 61, the register 14 and the DAC 13 in the same manner as the case where the offset voltage $V_1$ is calibrated. When the pre amplifier 32 and the comparator 61 are considered as a single comparator, the output offset voltages of the pre amplifier 32 and the comparator 61 can be considered to be 0. Thus, only the offset voltage $V_{off1}$ can be reduced.

In addition, the output offset voltages of the pre amplifiers 22, 42, 52 can be decreased by the same operation as the one described above.

(Operation of A/D Converter 1)

Next, an operation of the A/D converter 1 according to the first embodiment will be described.

Figure 6:
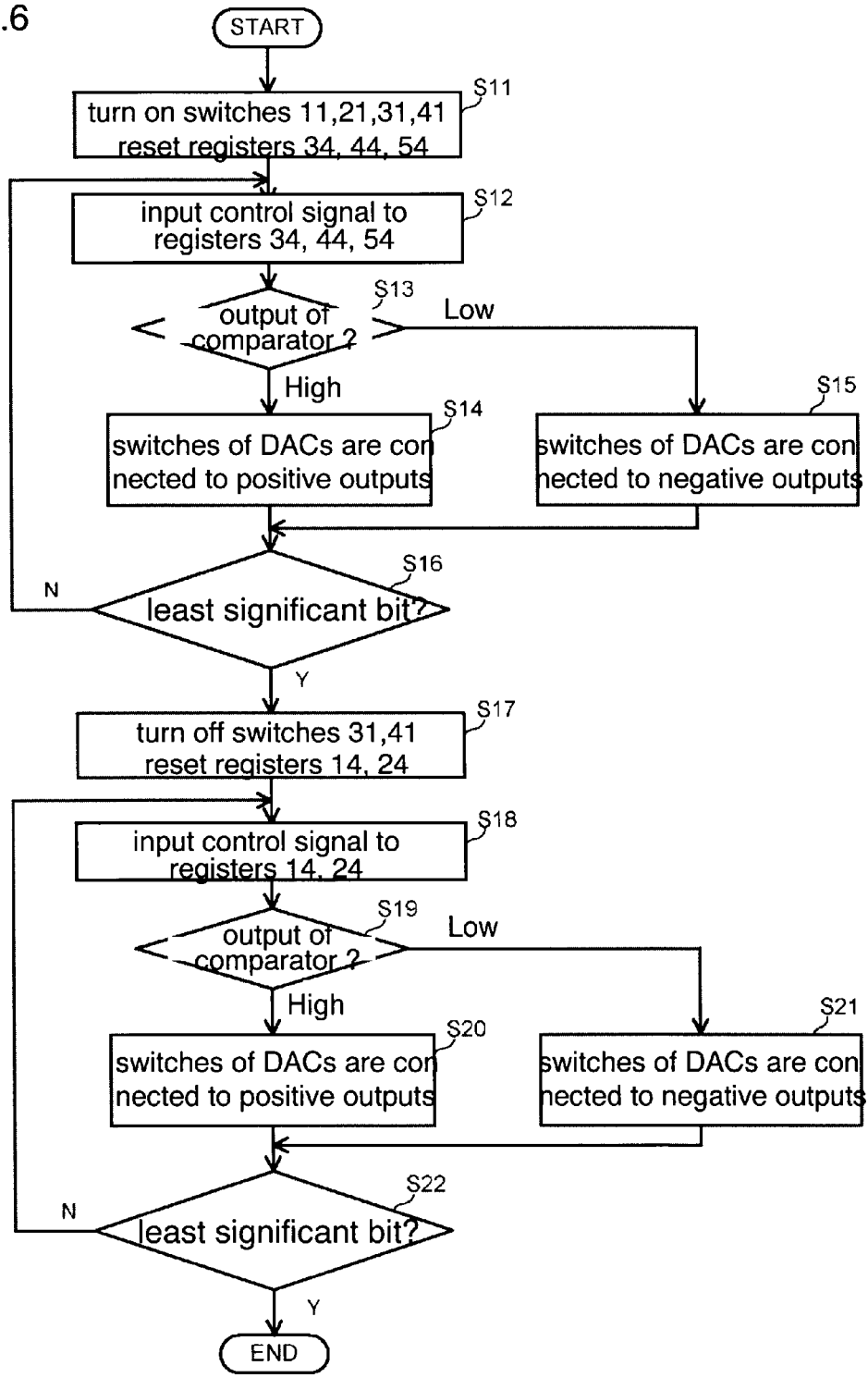
FIG. 6 is a flowchart showing an operation of the A/D converter.

FIG. 6 is a flowchart showing the operation of the A/D converter 1 according to the first embodiment.

The switch controller 71 turns on the switches 11a to 11c. Likewise, the switch controller 71 turns on each of the switches 21a to 21c, the switch 31a and the switch 41a. The control signal generation unit 72 inputs a reset signal to the registers 34, 44, 54 (step S11).

Next, the control signal generation unit 72 inputs a control signal to the registers 34, 44, 54 and then calibrates offset voltages. The control signal generation unit 72 inputs a control signal to the FF $Q_N$ corresponding to the most significant bit included in each of the registers 34, 44, 54 (step S12).

The control signal generation unit 72 inputs a control signal to the comparators 61 to 63. The comparators 61 to 63 compare positive output voltages and negative input voltages of the pre amplifiers 32, 42, 52, respectively. The comparators 61 to 63 input the High signal or Low signal to the registers 34, 44, 54 in accordance with the comparison results, respectively (step S13).

If the High signals are inputted from the comparators 61 to 63, the registers 34, 44, 54 short-circuit the current sources $I_N$ to the positive outputs $c_3$ to $c_5$ by controlling the switches $S_N$ of the DACs 33, 43, 53, respectively (step S14).

If the Low signals are inputted from the comparators 61 to 63, the registers 34, 44, 54 short-circuit the current sources $I_N$ to the negative outputs $d_3$ to $d_5$ by controlling the switches $S_N$ of the DACs 33, 43, 53, respectively (step S15).

The control signal generation unit 72 repeats the aforementioned operation until the least significant bit (No in step S16).

The switch controller 71 turns off the switches 31a, 41a (incidentally, the switches 11a to 11c may be turned on at this timing). The control signal generation unit 72 inputs a reset signal to the registers 14, 24 (step S17).

Next, the control signal generation unit 72 inputs a control signal to the registers 14, 24 and calibrates offset voltages. The control signal generation unit 72 inputs a control signal to the FF $Q_N$ corresponding to the most significant bit included in each of the registers 14, 24 (step S18).

The control signal generation unit 72 inputs a control signal to the comparators 61, 62. The comparators 61, 62 compare the positive output voltages and the negative input voltages. In accordance with the comparison results, the comparators 61, 62 input any one of the High signal and Low signal to the registers 14, 24, respectively (step S19).

If the High signals are inputted from the comparators 61, 62, the registers 14, 24 short-circuit the current sources $I_N$ to the positive outputs $c_1$, $c_2$ by controlling the switches $S_N$ of the DACs 13, 23, respectively (step S20).

If the Low signals are inputted from the comparators 61, 62, the registers 14, 24 short-circuit the current sources $I_N$ to the negative outputs $d_1$, $d_2$ by controlling the switches $S_N$ of the DACs 13, 23, respectively (step S21).

The control signal generation unit 72 repeats the aforementioned operation until the least significant bit (No in step S22).

Note that, the calibration of the output offset voltages of the pre amplifiers 32, 42, 52 may be performed in parallel by the pre amplifiers 32, 42, 52 (parallel processing), or may be performed one by one in a predetermined order (serial processing). In addition, the calibration of the output offset voltages of the pre amplifiers 12, 22 may be performed in the same manner.

As described above, with the A/D converter 1 according to the first embodiment, it is possible to effectively suppress the offset voltages of the pre amplifiers 12, 22 from being amplified by the pre amplifiers 32, 42 located at the later stage. Further, the offset voltages $V_{off1}$, $V_{off2}$ of the pre amplifiers 12, 22 located at the front stage are calibrated, so that a residual offset of an interpolation voltage can be calibrated in a parallel A/D converter using an interpolation technique.

In addition, the offset voltages of all of the pre amplifiers 12, 22, 32, 42, 52 and a later one included in the A/D converter 1 can be reduced, so that it is possible to effectively suppress deterioration of the resolution of A/D conversion.

Further, an amplitude of a differential signal outputted from each of the pre amplifiers 12, 22, 32, 42, 52 may be within such a small range that an offset voltage occurring at each of the pre amplifiers 12, 22, 32, 42, 52 and a later one can be calibrated. Thus, the AD converter according to the embodiment is more easily designed to operate at a low power supply voltage than a conventional A/D converter.

Note that, in order to suppress a voltage variation due to individual differences of the power supplies Vcc connected to the switches 11b, 11c, respectively, the A/D converter 1 according to the first embodiment is configured to short-circuit the input $a_1$, $b_1$ of the pre amplifier 12 by the switch 11a. The voltage variation between the inputs $a_1$, $b_1$ of the pre amplifier 12 can be effectively suppressed by employing the aforementioned configuration. However, a configuration not including the switch 11a may be employed in a case where the voltage variation due to the individual differences of the power supplies Vcc connected to the switches 11b, 11c, respectively, is small, and thus the influence of the variation on the calibration of the offset voltage is small. The switch 21 is configured in the same manner and has the same advantage.

Description of the Second Embodiment

In the first embodiment, a description is given of the embodiment in which offset voltages are calibrated by using N pieces of the current sources $I_1$ to $I_N$ whose current values are binary weighted. In the first embodiment, a voltage not greater than a voltage IR is not calibrated, the voltage IR being obtained by multiplying the current value I corresponding to the least significant bit (LSB) and a resistance R of the load resistance included in each of the pre amplifiers. Accordingly, a residual offset value exists.

In the second embodiment, a description will be given of an embodiment in which the offset voltages remaining at the later stage of the pre amplifiers 12, 22 are further reduced by calibrating the aforementioned residual offset voltages after the residual offset voltages are amplified at the second stage.

Figure 7:
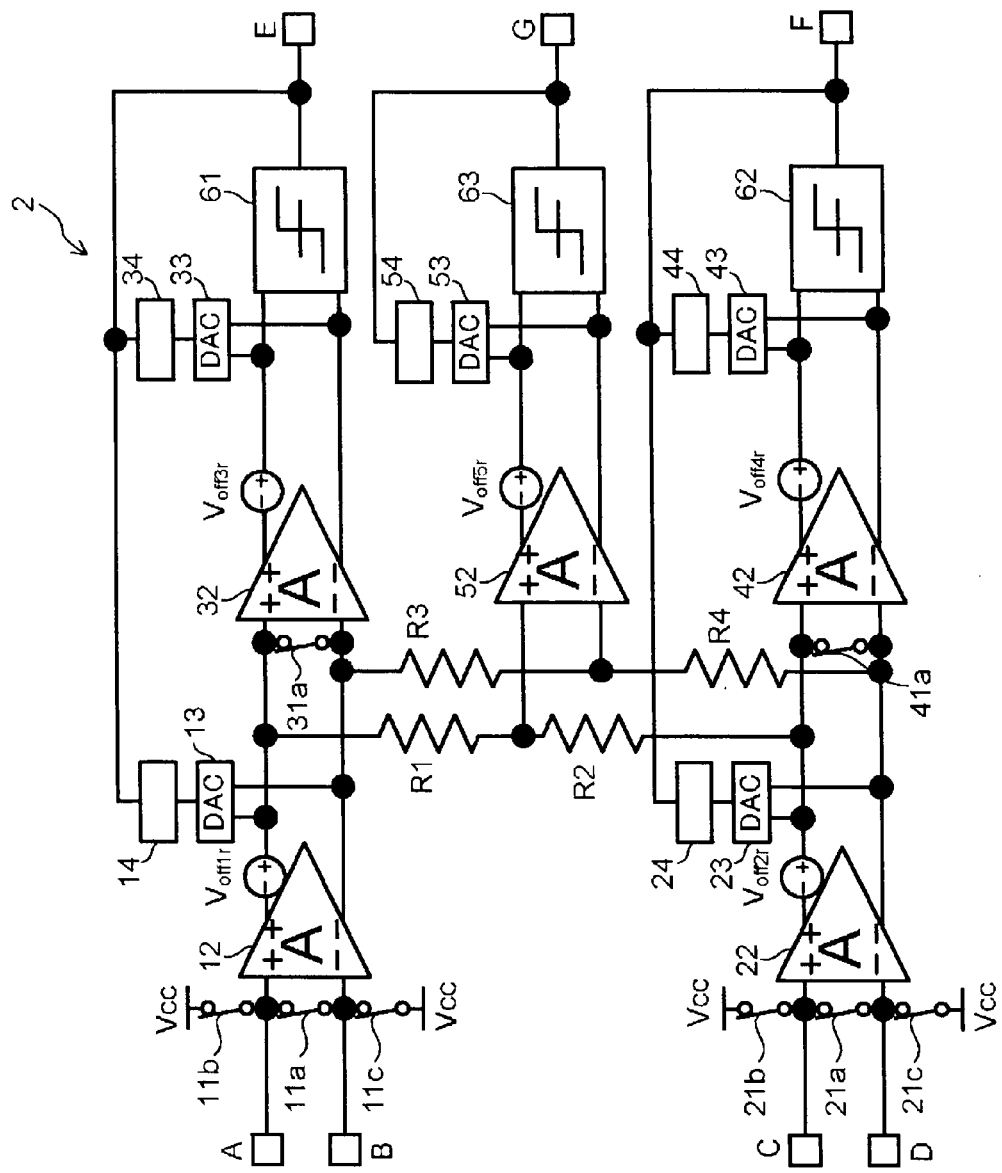
FIG. 7 is a diagram showing a configuration of an A/D converter according to a second embodiment.

FIG. 7 is a diagram to describe the calibration of the offset voltages. FIG. 7 illustrates residual offset voltages $V_{off1r}$ to $V_{off5r}$ of the respective pre amplifiers 12, 22, 32, 42, 52 after the offset voltages are calibrated by the operation shown in FIG. 6. Note that, an assumption is made that the residual offset voltages $V_{off1r}$ to $V_{off5}$ are smaller than the $V_{off1}$ to $V_{off5r}$, respectively.

In FIG. 7, illustrations of the switching controller 71 and the control signal generation unit 72 are omitted. As to the other constituent elements, the same constituent elements as those in FIG. 1 are denoted by the same reference numerals. Since these constituent elements are already described in FIG. 1, a duplicative description is omitted. Here, a description will be given of a case where a residual offset voltage of the pre amplifier 32 is calibrated.

(Calibration of Residual Offset Voltage)

Firstly, the operation from steps S11 to S22 described in FIG. 6 (hereinafter, referred to as a first calibration operation) is ended. At this time, an input conversion offset voltage $V_3$ at the terminals A, B, as viewed from the comparator 61 is expressed by following formula (3) since the $V_{off1r}$ is amplified by the pre amplifier 12, and the $V_{off3r}$ is amplified by the pre amplifiers 12, 32.

$$V_3 = (V_{off1r}/A) + (V_{off3r}/A^2) \quad (3)$$

Next, the switches included in the A/D converter 1 are set to the same states as the states when the first calibration operation is ended. Specifically, the switches 11a to 11c and the switches 21a to 21c are set to on state, and the switches 31a, 41a are set to off state. At this time, a residual offset voltage $V_4$ of the pre amplifier 32 is expressed by following formula (4) because the pre amplifier 32 amplifies the $V_{off1r}$.

$$V_4 = AV_{off1r} + V_{off3r} \quad (4)$$

The residual offset voltage $V_4$ can be calibrated by performing the same operation as the calibration of the offset voltage of the pre amplifier 32, described in FIG. 5. In other words, the residual offset voltage $V_4$ can be suppressed to be not greater than the smallest resolution of the DAC 13, again, by performing the same operation as the calibration of the offset voltage of the pre amplifier 32, described in FIG. 5. Through the operation, the offset voltage $AV_{off1r}$ of the input conversion of the pre amplifier 12 is calibrated, and only a residual offset $V_{off3r\_2}$, which is newly generated in the pre amplifier 32, remains.

A voltage $V_5$ resulting from input conversion of the residual offset voltage $V_{off3r\_2}$ again is expressed by following formula (5).

$$V_5 = V_{off3r\_2}/A^2 \quad (5)$$

Here, the residual offset voltages $V_{off3r}$, $V_{off3r\_2}$ can be considered to be approximately the same voltage values. Thus, the offset voltage is smaller by the amount of $V_{off1r}/A$ than in the case of the operation described in FIG. 5. Note that, the residual offset voltage of the pre amplifier 22 can be calibrated in the same manner.

(Operation of A/D Converter 2)

Next, an operation will be described.

Figure 8:
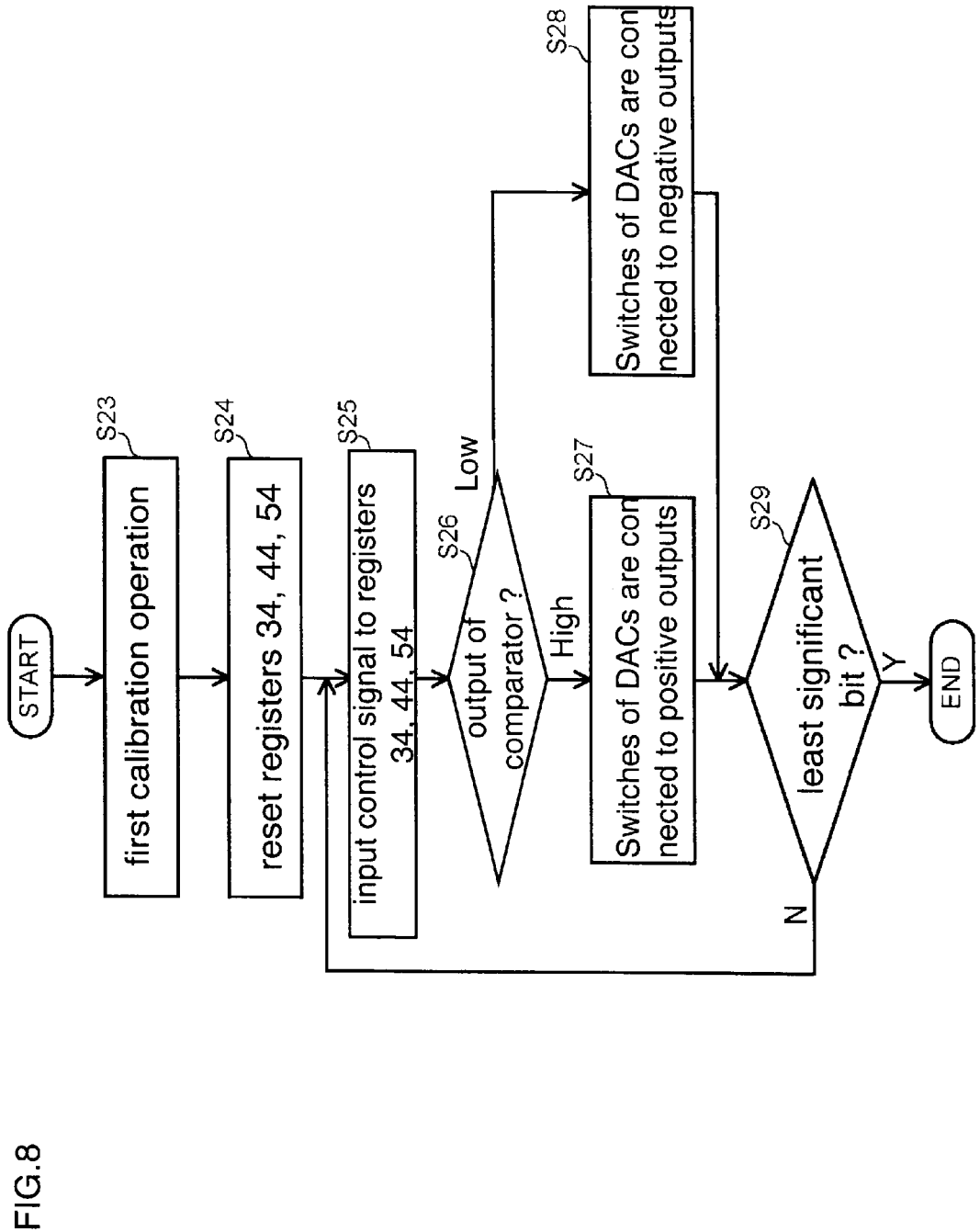
FIG. 8 is a flowchart showing an operation of the A/D converter.

FIG. 8 is a flowchart showing the operation of an A/D converter 2 according to the second embodiment.

The A/D converter 2 causes the first calibration operation (step S23) to be ended. Next, the switch controller 71 sets the switches 11a to 11c and the switches 21a to 21c to on state, and the switches 31a, 41a to off state (note that, this step may be omitted since the states of the switches are already set by the first calibration operation). The control signal generation unit 72 inputs a reset signal to the registers 34, 44, 54 (step S24).

Next, the control signal generation unit 72 inputs a control signal to the registers 34, 44, 54 and calibrates the offset voltages. The control signal generation unit 72 inputs a control signal to the FF $Q_N$ corresponding to the most significant bit included in each of the registers 34, 44, 54 (step S25).

The control signal generation unit 72 inputs a control signal to the comparators 61 to 63. The comparators 61 to 63 compare positive output voltages and negative input voltages. In accordance with the comparison results, the comparators 61 to 63 input any one of the High signal and Low signal to the registers 34, 44, 54, respectively (step 26).

If the High signals are inputted from the comparators 61 to 63, the registers 34, 44, 54 short-circuit the current sources $I_N$ to the positive outputs $c_3$ to $c_5$ by controlling the switches $S_N$ of the DACs 33, 43, 53, respectively (step S27).

If the Low signals are inputted from the comparators 61 to 63, the registers 34, 44, 54 short-circuit the current sources $I_N$ to the negative outputs $d_3$ to $d_5$ by controlling the switches $S_N$ of the DACs 33, 43, 53, respectively (step S28).

The control signal generation unit 72 repeats the aforementioned operation until the least significant bit (No in step S29).

Note that, calibration of the output offset voltages of the pre amplifiers 32, 42, 52 may be performed in parallel with one another by the pre amplifiers 32, 42, 52 (parallel processing), or may be performed one by one in a predetermined order (serial processing) in the same manner as the first embodiment.

As described above, the A/D converter 2 according to the second embodiment is configured to further calibrate the offset voltages remaining in the pre amplifiers 12, 22 after the calibration of the offset voltages described in FIG. 6. Thus, the offset voltages can be further reduced.

In addition, when calibrating an offset voltage at a certain level, the A/D converter 2 is capable of achieving the same outcome as a conventional A/D converter, only by using the DACs with lower resolution. Thus, the transistor size of the current source I, and the circuit area of the DAC can be made smaller. The other effects are the same as those obtained by the A/D converter 1 according to the first embodiment.

Description of the Third Embodiment

Figure 9:
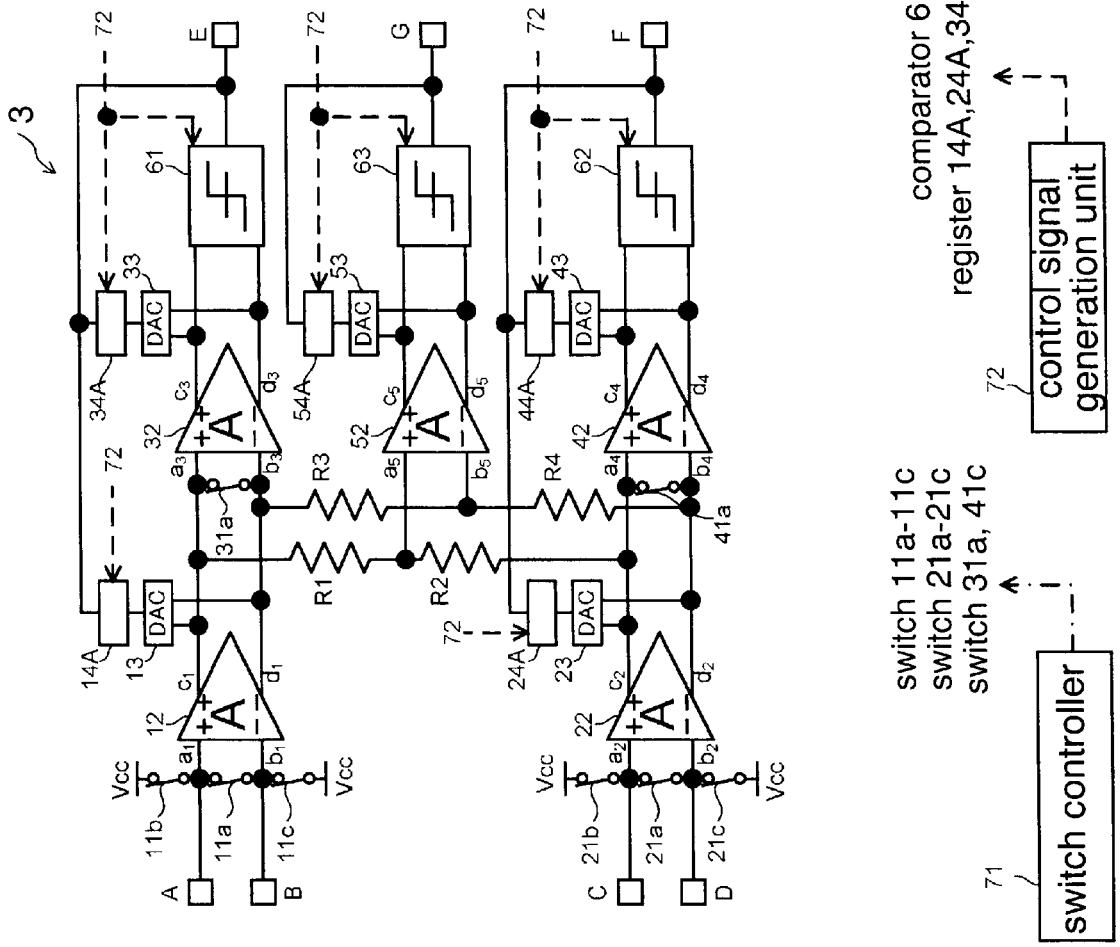
FIG. 9 is a diagram showing a configuration of an A/D converter according to a third embodiment.

FIG. 9 is a diagram showing a configuration of an A/D converter 3 according to a third embodiment. In the first and second embodiments, the registers 14, 24, 34, 44, 54 are used to control the DACs 13, 23, 33, 43, 53, respectively. In the A/D converter 3 according to the third embodiment, a description will be given of an embodiment in which counters 14A, 24A, 34A, 44A, 54A are used to control the DACs 13, 23, 33, 43, 53, respectively.

Note that, since the other constituent elements are already described in FIG. 1, the same constituent elements as those in FIG. 1 are denoted by the same reference numerals and a duplicative description is omitted.

The counter 34A outputs an output code 0 upon input of a control signal corresponding to the most significant bit after input of a reset signal from the control signal generator 72. The counter 34A increments the output code one by one each time the control signal is inputted from the control signal generation unit 72.

When the output code from the counter 34A is K, a current source $I_K$ included in the DAC 33 is connected to the positive output $c_3$ of the pre amplifier 32. In addition, a current source other than the current source $I_K$ is connected to the negative output $d_3$ of the pre amplifier 32. As a result, a current of $2^K I$ flows through the positive output $c_3$ of the pre amplifier 32. In addition, a current of $2^{(N-K-1)}I$ flows through the negative output $d_3$ of the pre amplifier 32.

When the output code of the counter 34A is 0, the voltage of the negative output $d_3$ of the pre amplifier 32 decreases by the amount of $2^{(N-1)}IR$. Thus, an offset voltage $V_6$ of the pre amplifier 32 is expressed by following formula (6).

$$V_6 = V_{off3} + V_{off11} + 2^{(N-1)}IR \quad (6)$$

Suppose that the offset voltage $V_6$ of the pre amplifier 32, which is expressed by formula (6), can be calibrated, an absolute value of $V_{off3} + V_{off11}$ is smaller than an absolute value of $2^{(N-1)}IR$. Thus, the value of the offset voltage $V_3$ is a positive value. As a result, the High signal is outputted from the comparator 61.

Each time the output code from the counter 34A is incremented by one, the offset value $V_3$ of the pre amplifier 32 decreases by the amount of 2IR. Then, the offset voltage $V_3$ of the pre amplifier 32 is a negative value, eventually. In this case, the Low signal is outputted from the comparator 61.

The counter 34A stores the output code when the signal from the comparator 61 switches from High to Low or Low to High.

The counter 34A maintains the stored output code. Through the aforementioned operation, the offset voltage $V_3$ of the pre amplifier 32 can be reduced.

Note that, the offset values of the pre amplifiers 12, 22, 42, 52 can be reduced as well by the same operation. The other effects are the same as those obtained in the first and second embodiments.

Description of the Fourth Embodiment

Figure 10:
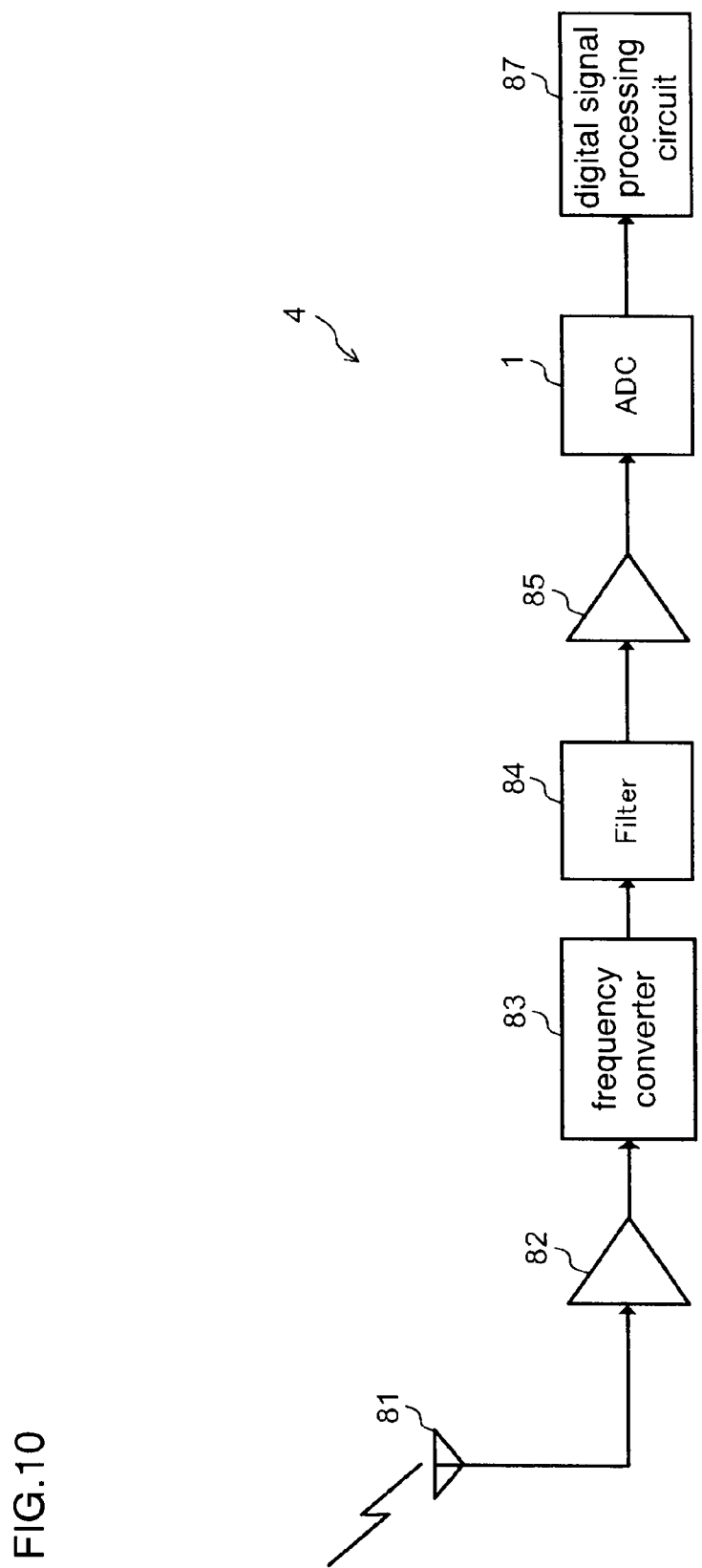
FIG. 10 is a diagram showing a configuration of a communication device according to a fourth embodiment.

FIG. 10 is a configuration diagram of a radio device 4 according to a fourth embodiment.

The radio device 4 includes an antenna 81 (receiver), an amplifier 82, a frequency converter 83, a filter 84, a gain-variable amplifier 85, the A/D converter 1 and a digital signal processing circuit 87 (demodulator).

The antenna 81 receives an analog radio signal. The amplifier 82 amplifies the analog signal received by the antenna 81. The frequency converter 83 converts the analog signal amplified by the amplifier 82 into a baseband signal formed of first and second voltage signals. The filter 84 allows only a given frequency band of the baseband signal converted by the frequency converter 83 to transmit through the filter 84. Specifically, the filter 84 removes an interference wave included in the aforementioned baseband signal.

The gain-variable amplifier 85 amplifies the output signal from the filter 84 and keeps the amplitude of the signal constant. The A/D converter 1 performs A/D conversion of the baseband signal from the gain-variable amplifier 85. The digital signal processing circuit 87 performs baseband signal processing including sample rate conversion, noise removal, demodulation and the like of the converted digital signal received from the A/D converter 86. Note that, instead of the A/D converter 1, the A/D converter 2 described in FIG. 7 or the A/D converter 3 described in FIG. 9 may be used.

As described above, the radio device 4 according to the fourth embodiment is configured to include any one of the A/D converters 1 to 3 described in the first to third embodiments, respectively. Note that, the effects obtained in the fourth embodiments are the same as those obtained in the first to third embodiments.

(Reference Example for Comparison)

Figure 11:
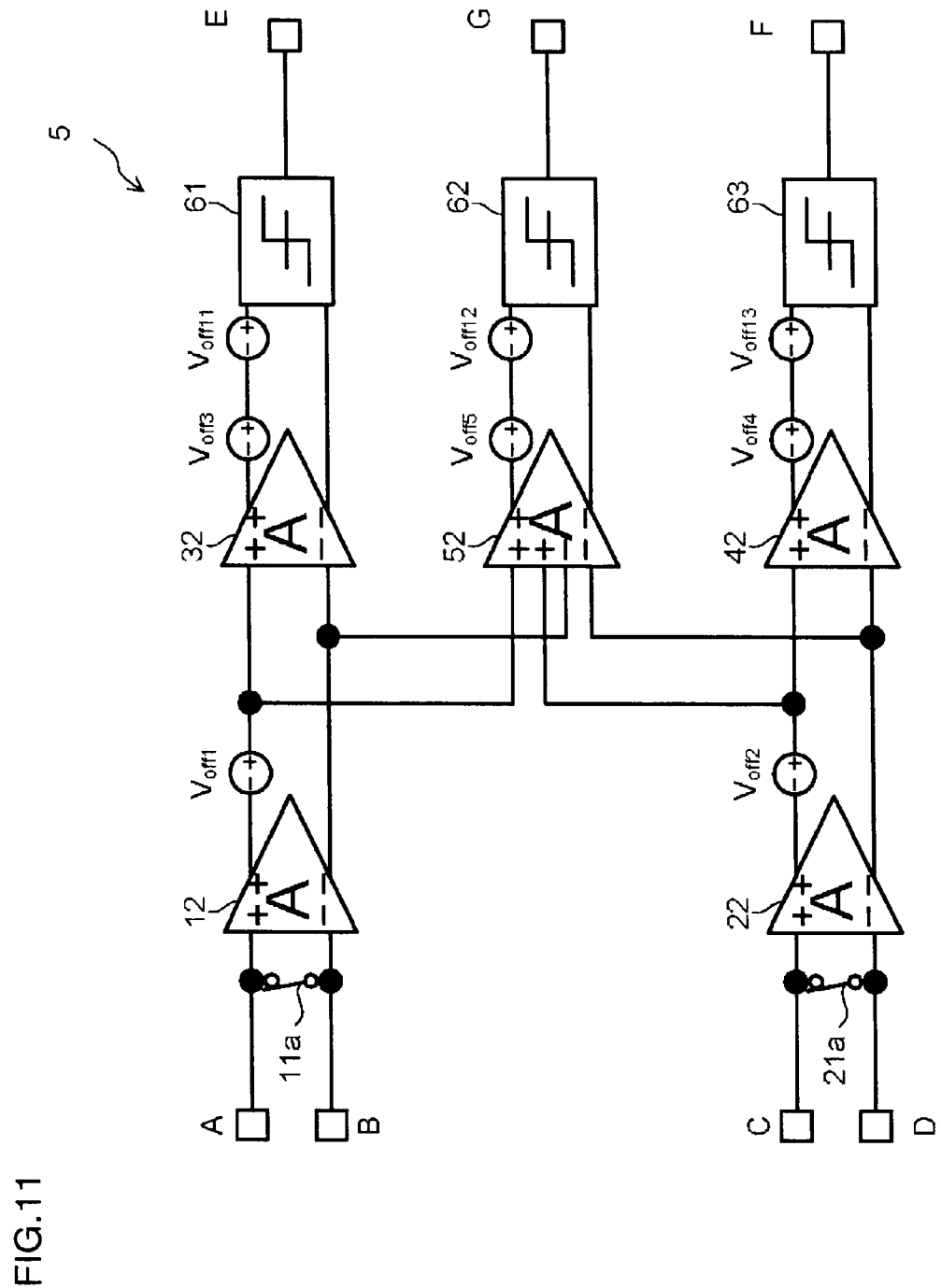
FIG. 11 is a diagram showing a configuration of an A/D converter according to a reference example.

FIG. 11 is a diagram showing an example of a configuration of an A/D converter 5 according to a reference example. Note that, the same reference numerals are assigned to the same constituent elements as those described in FIG. 1, and a duplicative description is omitted.

The A/D converter 5 includes the switches 11a, 21a, the pre amplifiers 12, 22, 32, 42, 52 and the comparators 61 to 63. The positive and negative outputs of each of the pre amplifiers 12, 22 are inputted to the positive and negative outputs of the pre amplifier 52, respectively. The inputted interpolation voltages are amplified by the pre amplifier 52. The amplified interpolation voltages are inputted to the comparator 62.

Here, consider a case where differential inputs of the pre amplifiers 12, 22 are connected. In this case, an offset voltage $V_7$ of the pre amplifier 32 is expressed by following formula (7) because the pre amplifier 32 amplifies the offset $V_{off1}$ of the pre amplifier 12 A times.

$$V_7 = V_{off1} + V_{off3} + V_{off11} \quad (7)$$

As described above, when the calibration range becomes larger due to the amplification of the offset voltage, an output signal range of the pre amplifier needs to be made larger. This makes it difficult to use a low voltage power source. Moreover, when the number of cascade connections of the pre amplifiers is three or greater, the offset voltage is further amplified by the pre amplifiers located at a later stage. Then, when the output signal of the pre amplifier is saturated due to the offset voltage, a normal operation cannot be performed.

Meanwhile, when the offset voltage of formula (7) is converted into an output of the pre amplifier 12, the offset voltage $V_{off3} + V_{off11}$ existing between differential outputs of the pre amplifier 32 is 1/gain A of the pre amplifier 32, i.e., $V_{off1} + (V_{off3} + V_{off11})/A$.

In order to calibrate the offset voltage $V_{off1} + (V_{off3} + V_{off11})/A$ by the output of the pre amplifier 12, the pre amplifier 12 may be caused to generate a voltage $-V_{off1} + (V_{off3} + V_{off11})/A$ at the output.

Likewise, the offset voltage converted as an offset voltage between the differential outputs of the pre amplifier 22 is $V_{off2} + (V_{off4} + V_{off12})/A$.

In order to calibrate the offset voltage $V_{off2} + (V_{off4} + V_{off12})/A$ by the output of the pre amplifier 22, the pre amplifier 12 may be caused to generate a voltage $-V_{off2} + (V_{off4} + V_{off12})/A$ at the output.

However, in a case where the offset voltage is calibrated by generating the voltage $-V_{off1} + (V_{off3} + V_{off11})/A$ at the output of the pre amplifier 12 at the first stage, $V_{off1}$ is calibrated, but $V_{off3} + V_{off11}$ is cancelled after being amplified by the pre amplifier 32. For this reason, when only the output of the pre amplifier 12 is considered, a residual offset voltage of $-(V_{off3} + V_{off11})/A$ occurs.

Likewise, a residual offset voltage of $-(V_{off4} + V_{off12})/A$ occurs on the output of the pre amplifier 22. Here, since the input voltage of the pre amplifier 52 is an average of the output voltages of the pre amplifiers 12, 22, the input voltage is $-(V_{off3} + V_{off4} + V_{off11} + V_{off12})/2A$.

Specifically, when the offset voltages of the pre amplifiers 12, 22 at the first stage are calibrated by using an interpolation technique, the offset voltage $-(V_{off3} + V_{off4} + V_{off11} + V_{off12})/2A$ occurs on the input voltage of the pre amplifier 52, that is, the interpolation voltage interpolated. Thus, the offset voltage occurring on the input side of the pre amplifier 52 cannot be calibrated.

The offset voltage occurring on the interpolation voltage can be calibrated at a later stage than the pre amplifier 52. However, the offset voltage needs to be calibrated after being amplified by the pre amplifier 52, the calibration range of the offset voltage needs to be large.

On the other hand, the A/D converters 1 to 3 described in the first to third embodiments, respectively, can effectively prevent the offset voltages of the pre amplifiers 12, 22 located at the front stage from being amplified by the pre amplifiers located at the later stage. In addition, the input voltage of the pre amplifier 52, that is, the offset voltage occurring on the interpolation voltage subjected to interpolation can be effectively reduced as well.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A calibration method for an A/D converter including a first amplifier to amplify first and second voltage signals, a second amplifier to amplify the first and second voltage signals amplified by the first amplifier, and a comparator to compare the first and second voltage signals amplified by the second amplifier, comprising:
   short-circuiting input ports of the second amplifier;
   comparing the first and second voltage signals inputted to the comparator to obtain a first result;

calibrating output voltage of the second amplifier in accordance with the first result of the comparison by the comparator;
short-circuiting input ports of the first amplifier;
opening the short-circuited input ports of the second amplifier;
comparing the first and second voltage signals inputted to the comparator to obtain a second result; and
calibrating output voltage of the first amplifier in accordance with the second result of the comparison by the comparator.

2. The calibration method of claim 1, further comprising:
comparing the first and second voltage signals inputted to the comparator to obtain the first result; and
calibrating the output voltage of the second amplifier in accordance with the first result of the comparison by the comparator.

3. A calibration method for an A/D converter including a first amplifier to amplify first and second voltage signals, a second amplifier to amplify the first and second voltage signals amplified by the first amplifier, a first comparator to compare the first and second voltage signals amplified by the second amplifier, a third amplifier to amplify third and fourth voltage signals, a fourth amplifier to amplify the third and fourth voltage signals amplified by the third amplifier, a second comparator to compare the third and fourth voltage signals amplified by the fourth amplifier, a first generation unit to generate an intermediate voltage signal between the first and third voltage signals amplified by the first and third amplifiers, respectively, a second generation unit to generate an intermediate voltage signal between the second and fourth voltage signals amplified by the first and third amplifiers, respectively, a fifth amplifier to amplify the intermediate voltage signals generated by the first and second generation units, respectively, and a third comparator to compare the intermediate voltage signals amplified by the fifth amplifier, the method comprising:
short-circuiting input ports of each of the second and fourth amplifiers;
comparing the first and second voltage signals inputted to the first comparator;
comparing the third and fourth voltage signals inputted to the second comparator;
comparing the intermediate voltage signals inputted to the third comparator;
calibrating output voltages of the second, fourth and fifth amplifiers in accordance with results of the comparisons by the first to third comparators, respectively;
short-circuiting input ports of each of the first and third amplifiers;
opening the short-circuited input ports of each of the second and fourth amplifiers;
comparing the first and second voltage signals inputted to the first comparator;
comparing the third and fourth voltage signals inputted to the second comparator; and
calibrating output voltages of the first and third amplifiers in accordance with results of the comparisons by the first and second comparators, respectively.

4. The calibration method of claim 3, further comprising:
comparing the first and second voltage signals inputted to the first comparator;
comparing the third and fourth voltage signals inputted to the second comparator;
comparing the intermediate voltage signals inputted to the third comparator; and
calibrating the output voltages of the second, fourth and fifth amplifiers in accordance with results of the comparisons by the first to third comparators, respectively.

5. An A/D converter comprising:
a first amplifier to amplify first and second voltage signals;
a second amplifier to amplify the first and second voltage signals amplified by the first amplifier;
a first comparator to compare the first and second voltage signals amplified by the second amplifier;
a first switch to short-circuit input ports of the first amplifier;
a second switch to short-circuit input ports of the second amplifier;
a first calibration unit to calibrate output voltages of the second amplifier in accordance with a result of the comparison by the first comparator while the second switch is keeping on; and
a second calibration unit to calibrate output voltages of the first amplifier in accordance with the result of the comparison by the first comparator while the first switch is keeping on and the second switch is keeping off.

6. The A/D converter of claim 5, further comprising:
a third amplifier to amplify third and fourth voltage signals;
a fourth amplifier to amplify the third and fourth voltage signals amplified by the third amplifier;
a second comparator to compare the third and fourth voltage signals amplified by the fourth amplifier;
a third switch to short-circuit input ports of the third amplifier;
a fourth switch to short-circuit input ports of the fourth amplifier;
a first generation unit to generate an intermediate voltage signal of the first and third voltage signals amplified by the first and third amplifiers, respectively;
a second generation unit to generate an intermediate voltage signal of the second and fourth voltage signals amplified by the first and third amplifiers, respectively;
a fifth amplifier to amplify the intermediate voltage signals generated by the first and second generation units;
a third comparator to compare the intermediate voltage signals amplified by the fifth amplifier;
a third calibration unit to calibrate output voltages of the fourth amplifier in accordance with a result of the comparison by the second comparator while the fourth switch is keeping on;
a fourth calibration unit to calibrate output voltages of the third amplifier in accordance with the result of the comparison by the second comparator while the third switch is keeping on and the fourth switch is keeping off; and
a fifth calibration unit to calibrate output voltages of the fifth amplifier in accordance with a result of the comparison by the third comparator while the second and fourth switches are keeping on.

7. The A/D converter of claims 6, wherein
the first to fifth calibration units include
first to fifth current supply units, respectively, the first to fifth current supply units supplying currents to the outputs of the first to fifth amplifiers, respectively; and
first to fifth controllers, respectively, the first to fifth controllers controlling the first to fifth current supply units, respectively, in accordance with the result of the comparison by the first to third comparators.

8. The A/D converter of claim 7, wherein
each of the first to fifth current supply units includes multiple current sources each having a current value weighted by a multiplier of two.

9. The A/D converter of claims 8, wherein each of the first to fifth controllers is anyone of a register circuit and a counter circuit.

10. A radio device comprising:

a receiver to receive a radio signal;

a converter to convert the radio signal into a baseband signal including first and second voltage signals;

a first amplifier to amplify the first and second voltage signals converted by the converter;

a second amplifier to amplify the first and second voltage signals amplified by the first amplifier;

a comparator to compare the first and second voltage signals amplified by the second amplifier thereby to generate a digital signal;

a first switch to short-circuit input ports of the first amplifier;

a second switch to short-circuit input ports of the second amplifier;

a first calibration unit to calibrate output voltages of the second amplifier in accordance with a result of the comparison by the comparator while the second switch is keeping on;

a second calibration unit to calibrate output voltages of the first amplifier in accordance with the result of the comparison by the comparator while the first switch is keeping on and the second switch is keeping off; and a signal processor to demodulate the digital signal from the first comparator.

* * * * *